(12) United States Patent
Park et al.

(10) Patent No.: US 7,433,791 B2
(45) Date of Patent: Oct. 7, 2008

(54) METHOD OF PERFORMING MULTIPLE STAGE MODEL CALIBRATION FOR OPTICAL IMAGING SIMULATION MODELS

(75) Inventors: Sangbong Park, Union City, CA (US); Duan-Fu Stephen Hsu, Fremont, CA (US); Edita Tejnil, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 89 days.

(21) Appl. No.: 11/708,137

(22) Filed: Feb. 20, 2007

(65) Prior Publication Data

US 2007/0213967 A1    Sep. 13, 2007

Related U.S. Application Data

(60) Provisional application No. 60/774,224, filed on Feb. 17, 2006.

(51) Int. Cl.
*G01D 18/00*   (2006.01)
*G01B 9/00*   (2006.01)
(52) U.S. Cl. .................................................. 702/85
(58) Field of Classification Search .................. 702/85
See application file for complete search history.

(56) References Cited

U.S. PATENT DOCUMENTS

| | | | |
|---|---|---|---|
| 5,402,333 A * | 3/1995 | Cardner ...................... | 700/31 |
| 2002/0036758 A1* | 3/2002 | de Mol et al. ................ | 355/53 |
| 2004/0049760 A1* | 3/2004 | Garza et al. .................. | 716/19 |
| 2006/0044542 A1* | 3/2006 | Park et al. .................... | 355/77 |
| 2008/0044748 A1* | 2/2008 | Han et al. ..................... | 430/22 |

* cited by examiner

*Primary Examiner*—Michael P. Nghiem
*Assistant Examiner*—Cindy H Khuu
(74) *Attorney, Agent, or Firm*—Pillsbury Winthrop et al.

(57) ABSTRACT

A method of calibrating a simulation model of a photolithography process. The method includes the steps of defining a set of input data; defining a simulation model having model parameters which affect the simulation result produced by the simulation model; performing a first stage calibration process in which the model parameters and alignment parameters are adjusted such that the simulation result is within a first predefined error tolerance; and performing a second stage calibration process in which the alignment parameters are fixed and the model parameters are adjusted such that the simulation result is within a second predefined error tolerance.

12 Claims, 8 Drawing Sheets

METHOD OF PERFORMING MULTIPLE STAGE MODEL CALIBRATION FOR OPTICAL IMAGING SIMULATION MODELS

CLAIM OF PRIORITY

This patent application, and any patent(s) issuing therefrom, claims priority from U.S. provisional patent application No. 60/774,224, filed on Feb. 17, 2006, entitled "Method Of Multiple Stage Model Calibration For Optical Proximity Correction", which is incorporated herein by reference in its entirety.

FIELD OF INVENTION

The technical field of the invention relates generally to a method and program product for calibrating a model utilized to simulate the imaging performance of a given photolithography process. Such simulation models are typically utilized to assist in the application of optical proximity correction (OPC) treatments on a mask design to be utilized in the actual imaging process.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such a "multiple stage" apparatus the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (or mask image transfer to wafer). Another goal is to optimize illumination and enhance the contrast of an image (reproduction of circuit design) on a wafer. By increasing the overall process window (i.e., the ability to consistently print features having a specified CD regardless of whether or not the features are isolated or densely packed relative to adjacent features), one may be able to more easily accomplish each one of the goals.

Methods for optimizing the source illumination and mask patterns so as to improve the overall printing performance have been disclosed in the prior art. For example, one known technique for optimizing mask designs is referred to as optical proximity correction or OPC. In order for any optimization process to be efficient and produce useful results, it is essential to have a good model of the imaging process that can be utilized to perform simulations of the imaging process during the optimization process.

Further, in order to achieve an accurate model, it is typically necessary to utilize large amounts of wafer pattern measurement data in the model calibration process. For example, using 1-dimensional (1-D) CD values as input data for model calibration typically requires a large number of CD measurements (in the order of thousands) in order to obtain an accurate model. However, such a process can miss important information contained in the high frequency features such as corners and line ends where the pattern fidelity can impact IC device performance on the wafer.

In order to include as complete a set of information as possible about the lithography process in question, recent calibration methods are utilizing wafer SEM pictures that contain not only line or space dimension information but also include 2-dimensional (2-D) structure information. One problem arising from the use of 2-D SEM pictures for the model calibration process is that it requires the optimization step to include performing an alignment process, with sufficient accuracy, between the SEM pictures and the resist image simulated intended mask patterns (or GDSII design patterns). In other words, the calibration includes a calculation and/or optimization step to verify that the 2-D SEM pictures are properly aligned with the target pattern in addition to the optimization of optical and resist parameters (i.e., model parameters) defining the imaging process. This need in performing the alignment process results in an unwanted increase of computation time required for the model optimization/calibration process because of increased number of parameters in this type of multi-dimension non-linear optimization.

Accordingly, it is an object of the present invention to provide a model calibration process that allows for the use of 2-D structural information (or greater), but minimizes and/or reduces the increased time required for performing the initial alignment process required when utilizing 2-D structural information in the model calibration process.

SUMMARY OF THE INVENTION

In an effort to solve the foregoing needs, it is an object of the present invention to provide a method for performing a model calibration process that minimizes/reduces the time required for performing the calibration process when modeling complex 2-D structures.

More specifically, the present invention relates to a method of calibrating a simulation model of a photolithography process. The method includes the steps of defining a set of input data; defining a simulation model having model parameters which affect the simulation result produced by the simulation model; performing a first stage calibration process in which the model parameters and alignment parameters are adjusted such that the simulation result is within a first predefined error tolerance; and performing a second stage calibration process in which the alignment parameters are fixed and the model parameters are adjusted such that the simulation result is within a second predefined error tolerance.

In addition, the present invention relates to a computer program product embedded in a recording medium operable for controlling a computer to perform a calibration process of a simulation model of a photolithography process. The calibration process comprises the steps of defining a set of input data; defining a simulation model having model parameters which affect the simulation result produced by the simulation model;performing a first stage calibration process in which the model parameters and alignment parameters are adjusted such that the simulation result is within a first predefined error tolerance; and performing a second stage calibration process in which the alignment parameters are fixed and the model parameters are adjusted such that the simulation result is within a second predefined error tolerance.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, the present invention provides a method for generating a calibrated model of an imaging process, which utilizes complex 2-D structures in the calibration process, and which minimizes the time required for the process to calibrate the model. Specifically, the method minimizes and/or reduces the time associated with determining and/or calibrating the alignment parameters associated with the calibration process, which are necessary due to the use of 2-D structures.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

As noted above, processes for calibrating models of imaging systems are well known. Further, as explained above, when generating a model to predict the imaging of complex 2-D structures, there are advantages associated with utilizing SEM pictures/images that contain 2-D information when generating the model. However, when using 2-D SEM pictures for the calibration, it is necessary to determine the correct alignment (overlap) between the intended mask patterns (i.e., the original GDSII design pattern) used to print the wafer pattern and the patterns in the SEM picture.

Because the wafer pattern (SEM picture) and mask pattern (original GDSII design data) can be significantly different from each other due to low k1 lithography process, an accurate alignment between the two is not easily obtained, and yet such an alignment must be accurately performed as an initial part of the calibration process before the calibration of the remaining parameters (i.e., optical and resist parameters) can be performed.

Figure 1:
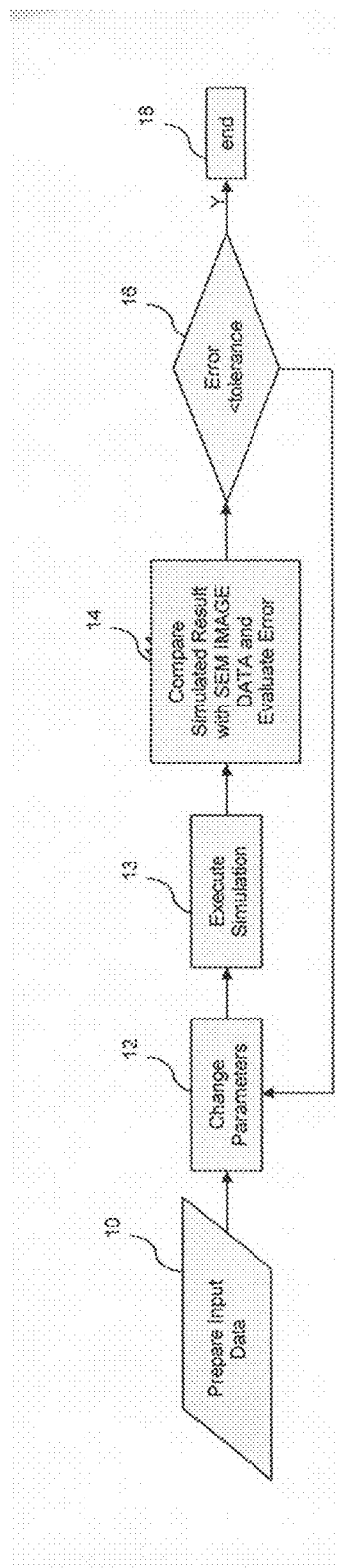
FIG. 1 illustrates a flow-chart of a prior art calibration process.

Currently, prior art calibration methods utilize an optimization method in which all the alignment parameters including, but not limited to, rotation, magnification, and translation of the SEM images relative to the GDSII data are optimized (calculated) simultaneously with real model parameters (e.g., optical and resist parameters) that describe the lithography process. FIG. 1 illustrates a typical prior art calibration process. Referring to FIG. 1, the first step in the process (Step 10) is to prepare the input data, which entails, in part, defining the target pattern, defining the imaging process to be utilized to image the target pattern, and generating 2-D SEM images utilizing the target pattern and the imaging process (this step requires an actual imaging process). Once the input data is prepared, the process proceeds to Step 12 in which the parameters of the calibration process (i.e., alignment parameters and model parameters), which effectively define the resulting simulated image, are adjusted (the first pass through the process, the parameters are set at an initial value). The process then proceeds to Step 13, in which the simulation process is executed so as to generate a 2-D aerial image (or equivalent) based on the imaging model utilizing the current parameters. It is noted that essentially any model calibration program, such as, for example, those offered for sale by ASML MaskTools, Inc., and the one disclosed in U.S. Pat. No. 7,175,940, which is hereby incorporated by reference in its entirety, can be modified to implement the model calibration method of the present invention.

Thereafter, the simulated images produced by the model are compared with the 2-D SEM images and the difference (i.e., error) between the two sets of images is determined (Step 14). If the resulting error is less than a predefined tolerance (Step 16), the imaging model is deemed calibrated, and the process is complete (Step 18). However, if the resulting error is greater than the predefined error tolerance, the process proceeds back to Step 12, where the parameters (i.e., alignment parameters and model parameters) are adjusted in an effort to minimize the difference between the simulated image generated by the model and the 2-D SEM images generated by the actual imaging process, and then steps 13, 14 and 16 are repeated. This reiterative process continues until the difference between the simulated image and the 2-D SEM images satisfy the predefined error tolerance.

One of the problems with the prior art process of FIG. 1 is that alignment parameters, such as rotation, magnification and translation parameters of the SEM images relative to the GDSII data representing the simulated image are optimized (i.e., calculated) simultaneously with the real model parameters (i.e., optical parameters and resist parameters) that define the lithography or imaging process. More specifically, the problem with this simultaneous optimization of alignment parameters and the model parameters is that the number of the alignment parameters increases dramatically along with number of 2-D SEM pictures being utilized in the calibration process. For example, even when the optimization/calibration is performed utilizing common rotation and magnification parameters for all of the 2-D SEM pictures used in the calibration, the translation parameters have to be optimized separately for each 2-D SEM image, and each SEM image adds two translational (e.g., Tx, Ty) parameters.

Thus, for a typical calibration utilizing thirty 2-D SEM images, there are 60 translation parameters (an X and Y translation parameter for each SEM image) and 4 additional rotation and scale parameters (2 rotational and 2 magnification parameters) that need to be optimized. As such, utilizing the prior art process of FIG. 1, it is necessary to calculate a substantial number of geometry fitting parameters (i.e., alignment parameters) each time the optimization step is performed in the iterative process, in addition to calculating the real model parameters (i.e., optical parameters and resist parameters) as defined by the model. It is noted that the alignment parameters are not included in the final calibrated model. However, the inclusion of the alignment parameters, which are significant in number, in the optimization step of the reiterative process, results in a significant increase in the number of parameters being optimized. As a result, there is typically a significant increase in the required computational time necessary for the optimization engine to determine the optimal parameters for the given model calibration process. As such, the overall optimization process is substantially longer, which is clearly undesirable.

Figure 5:
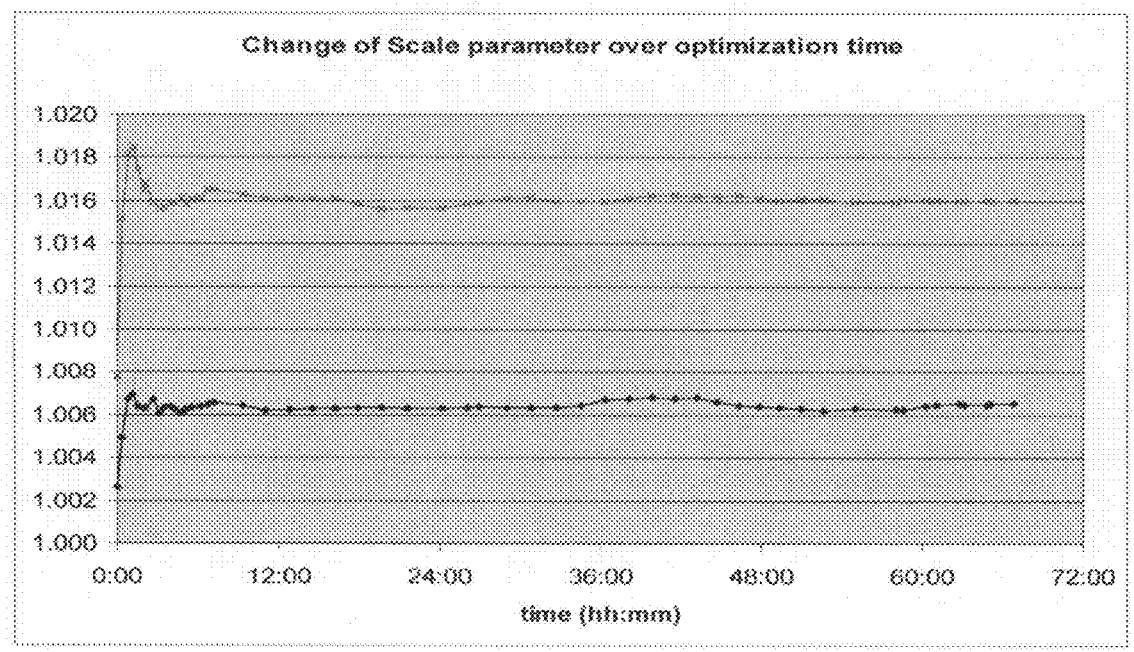
FIG. 5 illustrates an exemplary graph indicating how alignment parameters change during the calibration process (i.e., calibration run-time).
Figure 6:
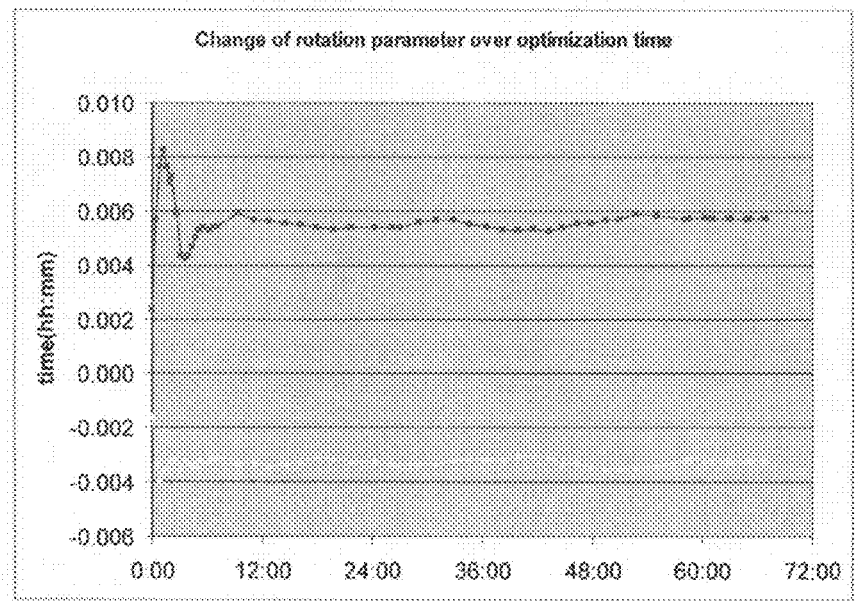
FIG. 6 illustrates an exemplary graph indicating how rotational parameters change during the calibration process (i.e., calibration run-time).
Figure 7:
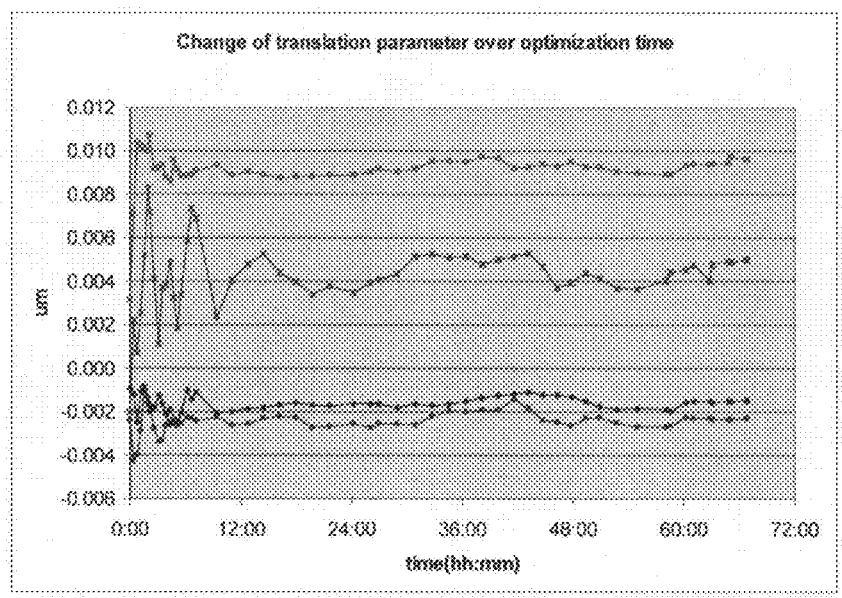
FIG. 7 illustrates an exemplary graph indicating how translation parameters change during the calibration process (i.e., calibration run-time).

In accordance with the present invention, because the alignment parameters are not actually used for determining the model dynamics that predict correct wafer imaging, the alignment parameters can be separated from other model parameters. Indeed, it can be shown that the alignment parameters are almost constant early on in the optimization process. As illustrated in the graph of time (i.e., number of iterations) versus alignment parameter adjustment of FIG. 5, the alignment parameters do not change significantly after passing an initial optimization stage. FIGS. 6 and 7 illustrate specifically how the rotation parameters and translation parameters, respectively, become essential constant quite early in the iteration/calibration process.

Thus, the alignment parameters do not need to be optimized (i.e., calculated) during each optimization iteration. Rather, it is possible to calculate the alignment parameters only at the initial stage of optimization process, and thereafter fix the alignment parameters and only vary the other model parameters during the calibration of the simulation model. To summarize, in the first stage of the calibration process, optical parameters and alignment parameters are considered in the optimization/calibration process. However, in the second stage of the calibration process, the alignment parameters determined in the first stage are fixed, and only the optical and all other model parameters necessary for the given optimization process are varied during the subsequent calibration process. Importantly, as a result of the process of the present invention, the number of parameters being optimized simultaneously during each iteration step is significantly reduced, thereby providing a significant reduction in the required optimization time, regardless of the particular optimization algorithm being utilized.

Figure 2:
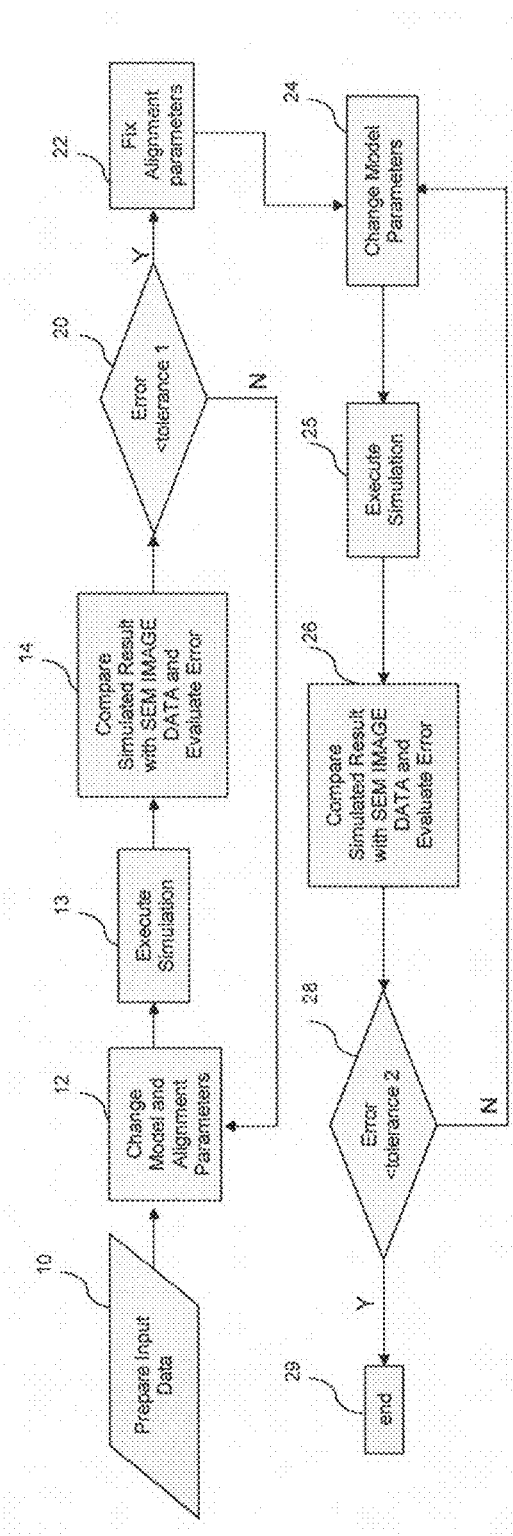
FIG. 2 is an exemplary flow chart illustrating a first embodiment of the calibration process of the present invention.

FIG. 2 illustrates an exemplary flowchart of a first embodiment of the calibration process of the present invention. Referring to FIG. 2, the first step in the process (Step 10) is to prepare the input data, which as discussed above in conjunction with FIG. 1, entails, in part, defining the target pattern, defining the imaging process to be utilized to image the target pattern, and generating 2-D SEM images utilizing the target pattern and the imaging process. Once the input data is prepared, the process proceeds to Step 12 in which the parameters of the calibration process (i.e., alignment parameters and model parameters), which effectively define the resulting simulated image, are adjusted (the first pass through the process, the alignment and model parameters are set at an initial value). The process then proceeds to Step 13, in which the simulation process is executed so as to generate a 2-D aerial image (or equivalent) based on the imaging model utilizing the current alignment and model parameters. Thereafter, the simulated images produced by the model are compared with the 2-D SEM images and the difference (i.e., error) between the two sets of images is determined (Step 14). The process then proceeds to Step 20 to determine if the resulting error between the simulated result and the SEM images is larger than a first predefined tolerance. This first predefined tolerance is larger than the final error tolerance acceptable for the calibration model. Specifically, the first error tolerance defines an error tolerance which corresponds to the alignment parameters being optimized or calibrated. Alternatively, the first error tolerance can be selected such that it is within a defined percentage of the final acceptable error tolerance, for example, 10% or 20% of the final error tolerance. Typically, the first error tolerance would be based on the given calibration process. It is noted that as with the final acceptable error tolerance, the first error tolerance would be process and design dependent and can be specified by the designer/operator prior to executing the calibration process.

If the resulting error is greater than the predefined error tolerance, the process proceeds back to Step 12, where all parameters (i.e., alignment and model parameters) are adjusted in an effort to minimize the difference between the simulated result and the SEM images, and then steps 13, 14 and 20 are repeated. This reiterative process continues until the alignment and model parameters are set such that the error between the simulated result and the SEM images is less than the first predefined error tolerance.

Once this occurs, the process proceeds to Step 22, in which all the alignment parameters (e.g., translation, rotational and scale parameters) are fixed at their current values. The process then proceeds to Step 24 in which only the model parameters of the calibration process are adjusted to further calibrate the model. It is noted that during the first pass through the process, the model parameters are set at the values corresponding to those for obtaining an error less than the first error tolerance. The process then proceeds to Step 25, in which the simulation process is executed so as to generate a 2-D aerial image (or equivalent) based on the imaging model utilizing the fixed alignment parameters and the current model parameters. Thereafter, the simulated result produced by the model is compared with the 2-D SEM images and the difference (i.e., error) between the two sets of images is determined (Step 26). The process then proceeds to Step 28 to determine if the resulting error is larger than a second predefined error tolerance. This second predefined error tolerance corresponds to the acceptable final error tolerance for the calibration model. If the resulting error between the simulated image and the 2-D SEM images is less than the second error tolerance, then the process is complete (Step 29) and the model is deemed calibrated.

However, if the resulting error is greater than the second error tolerance, the process proceeds back to Step 24, where only the model parameters are adjusted in an effort to minimize the difference between the simulated result and the 2-D SEM images, and then steps 25, 26 and 28 are repeated. Importantly, the same alignment parameters fixed in Step 22 are utilized during the further calibration of the model parameters performed in the reiterative process defined by Steps 25, 26 and 28. As noted above, by fixing the alignment parameters in a first stage of the calibration process and only considering/adjusting the model parameters in a second stage of the calibration process, the present invention provides a substantial reduction in the time required to perform the calibration process.

Figure 3:
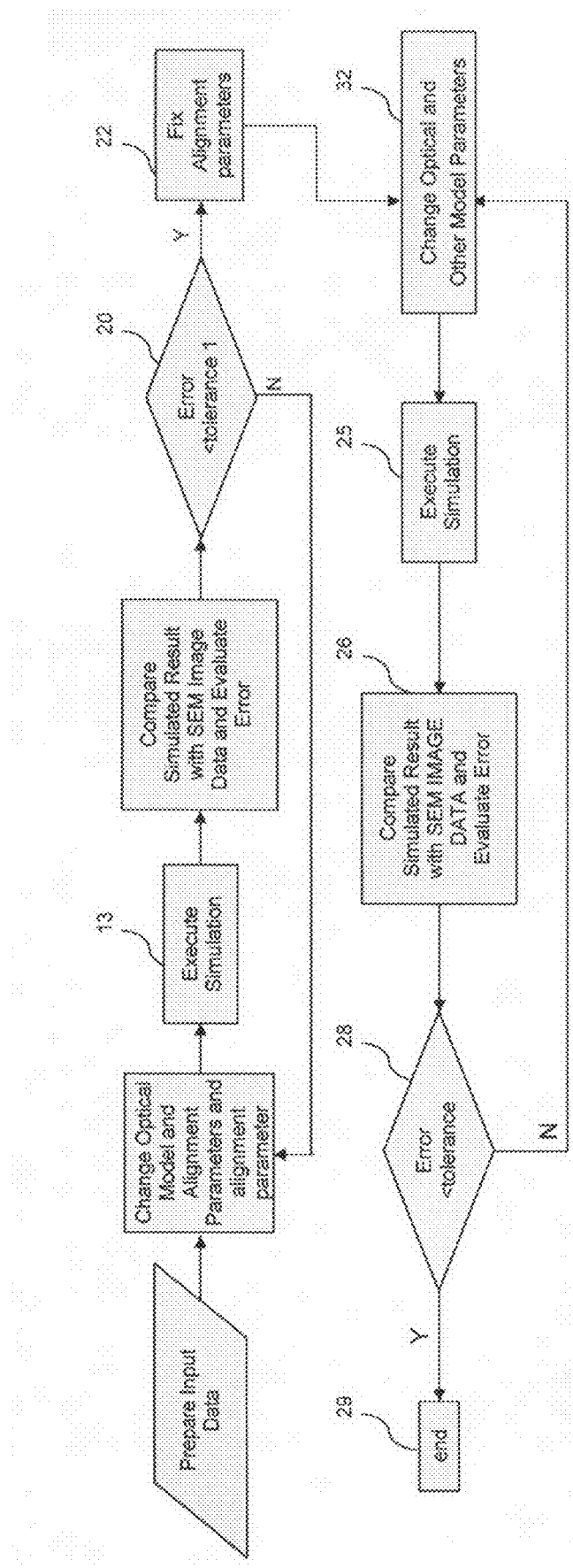
FIG. 3 is an exemplary flow chart illustrating a second embodiment of the calibration process of the present invention.

FIG. 3 is a flowchart illustrating a second exemplary embodiment of the present invention. The process of the second embodiment is substantially similar to the process of the first embodiment with the following exceptions. During the first stage of the calibration process, with regard to the model parameters being adjusted, only the optical parameters are adjusted, and the resist parameters are set as predefined values. As such, during the first stage, only the alignment parameters and the optical parameters are calculated/adjusted during each iterative process until such time as the resulting simulated image matches the 2-D SEM images within the first error tolerance. Once this is done, and the alignment parameters are fixed in Step 22, the resist parameters and the optical parameters can be adjusted during the second stage of the calibration process. As shown in Step 32, both the optical and resist parameters can be adjusted. Thus, in the second stage of the calibration process, which is defined by Steps 32, 25, 26 and 28, the alignment parameters are fixed and both the optical and resist parameters can be adjusted until the difference between the resulting simulated image and the 2-D SEM images is less than the second error tolerance.

Figure 4:
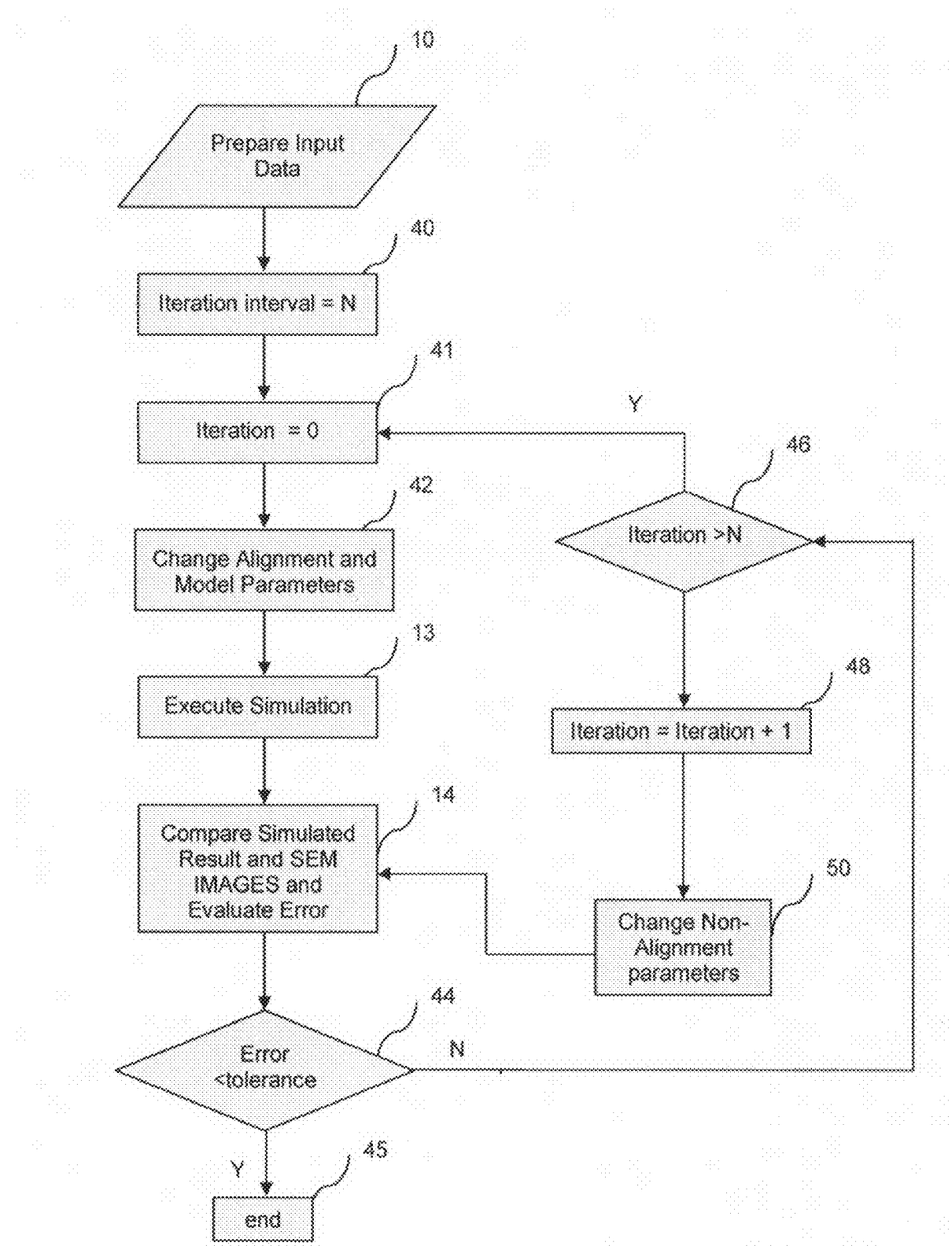
FIG. 4 is an exemplary flow chart illustrating a third embodiment of the calibration process of the present invention.

FIG. 4 is an exemplary flow chart illustrating a third embodiment of the calibration process of the present invention. In this embodiment as explained below, the alignment parameters are updated each time a certain predetermined number of iterations (i.e., modification of the model parameters) are performed. As such, similar to the first and second embodiments, the alignment parameters are not computed during each iteration step, but only updated periodically so that the overall calibration process can be performed in a reduced time period.

Referring to FIG. 4, the first step in the process (Step 10) is to prepare the input data. It is noted that like steps in FIGS. 1-4 have been indicated utilizing the same reference numbers. The next step (Step 40) is to identify the iteration interval, which defines the number "N" of iterations of adjusting the model parameters that will occur in between the adjustment of the alignment parameters. The iteration interval number can be defined by the design/operator. Next, the iteration number is initial set to zero (Step 41). In Step 42, the model parameters and alignment parameters are adjusted (for the first pass through the process, the model parameters and alignment parameters can be set to an initial value). Next, in Step 13, the simulation process is executed so as to generate a 2-D simulated aerial image (or equivalent) based on the model utilizing the current parameters. Thereafter, the simulated images produced by the model are compared with the 2-D SEM images and the difference (i.e., error) between the two sets of images is determined (Step 14). The process then proceeds to Step 44 to determine if the resulting error is larger than a predefined error tolerance. It is noted that in the given embodiment, the error tolerance defined in Step 44 corresponds to the final acceptable error tolerance for the given design. If the resulting error computed in Step 14 is less than the error tolerance, the process is complete (Step 45) and the model is deemed calibrated.

However, if the error is greater than the predefined error tolerance, the process proceeds to Step 46 to determine if the current iteration number is greater than "N". If the answer is no, the process proceeds to Step 48, where the current iteration number is updated by "1", and then to Step 50 in which the non-alignment parameters (i.e., the model parameters) are updated in an effort to reduce the error in the same manner as discussed above with regard to the first embodiment. Thereafter, the process proceeds to perform Steps 13, 14, and 44 again. This loop continues to be executed until either: (1) the resulting simulated image matches the 2-D SEM images within the predefined error tolerance, or (2) the current iteration number is greater than the iteration interval number "N" (as determined by Step 46). When the later occurs the process proceeds back to Step 41 to reset the current iteration number to zero, and then to Step 42 so as to change/update all of the parameters (i.e., alignment parameters and model parameters) in an effort to minimize the error, and then the process proceeds to Step 13, and repeats the process as detailed above. As such, in accordance with the third embodiment, the alignment parameters are only computed/adjusted every "N" iterations of adjustment of the model parameters, which as with the first and second embodiments, results in a substantial time reduction of the calibration process.

Figure 8:
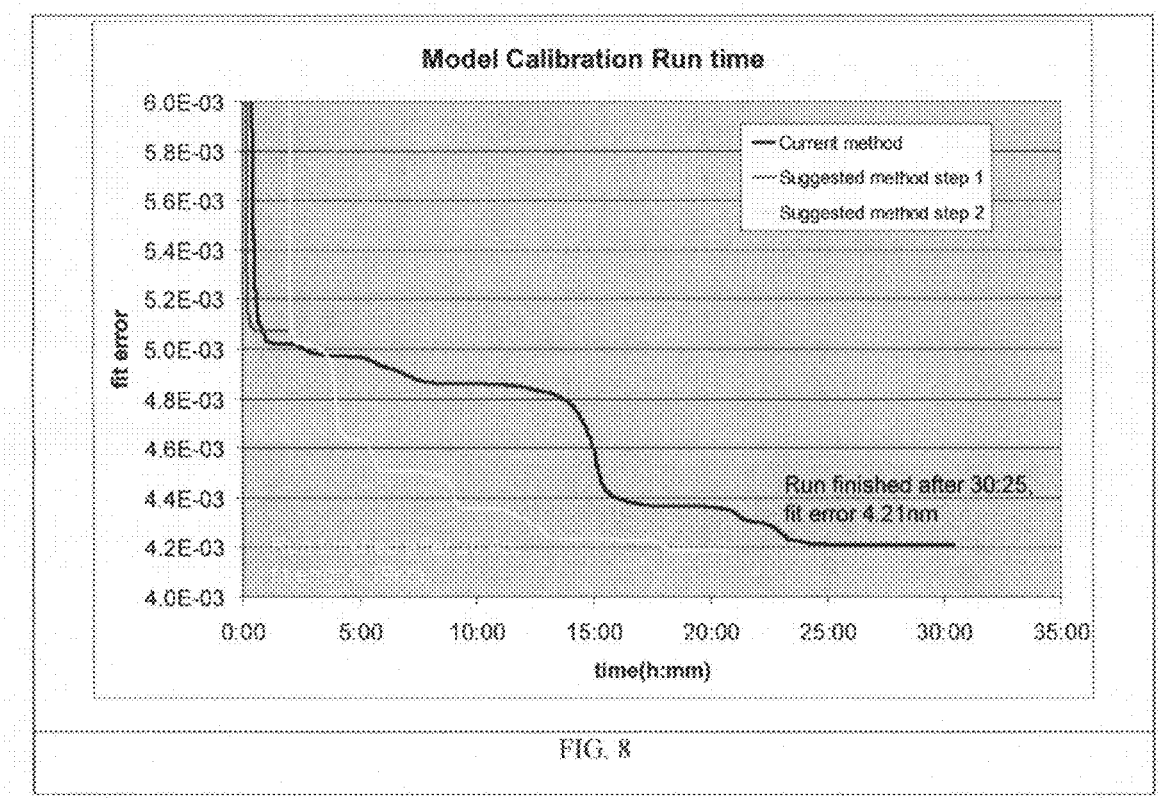
FIG. 8 illustrates a comparison of model calibration run times comparing a prior art calibration method with the calibration methods of the present invention.

FIG. 8 illustrates an exemplary comparison of model calibration run times comparing prior art methods with the methods of the present invention. Specifically, FIG. 8 is a graph illustrating the run time for the calibration process versus the reduction in error comparing the prior art process, with the processes of the first and second embodiment of the present invention. As shown in FIG. 8, in the given examples, the time required to perform the calibration was reduced by almost ⅓ in comparison to the prior art.

As noted above, the method of the present invention provides important advantages over the prior art. Most importantly, the present invention provides a method for generating a calibrated model of an imaging process, which utilizes complex 2-D structures in the calibration process, and which minimizes the time required for the process to calibrate the model. Specifically, the method minimizes and/or reduces the time associated with determining and/or calibrating the alignment parameters associated with the calibration process, which are necessary due to the use of 2-D structures.

It is further noted that variations of the foregoing embodiments are also possible. For example, assuming a model has already been calibrated, and then there is a need to modify the resist processing of the fabrication process for some reason, it is possible to utilize the multi-stage calibration process of the present invention to fix the optical parameters and alignment parameters already calibrated, and only re-calibrate the model for the new resist process (i.e., only adjust the resist parameters).

With regard to the parameters discussed above, it is noted that the specific parameters to be optimized would vary from model to model and process to process. However, the terms alignment parameters, optical parameters and resist parameters are well known by those of skill in the art, and would be readily determinable by those of skill in the art once the model to be utilized is defined. For example, optical parameters are often represented utilizing kernels, which are functions representing the optical exposure tool characteristics. The user/operator can select the appropriate number of kernels to be utilized, and can select whether all of the kernel amplitudes are optimized or lock each kernel's amplitude ratio and optimize a global scale parameter. In the former case, the number of amplitudes to be optimized equals the number of kernels used in the calibration. In the latter case, number of parameters to optimize is one.

The effect of mask topography (i.e., different thickness of each mask material) can be also be modeled and optimized. For example, every border between each different material on the mask can be optimized for their effective optical properties (usually two). As such, if the mask consists of three different materials which abut each other, the number of corresponding parameters becomes six (i.e., 3 borders, two parameters each).

Non-optical parameters include resist/process parameters. In many instances, Gaussian functions are used to mimic the resist/process behavior of the lithographic printing process. The number of Gaussian functions to be used can be decided by the operator. Each Gaussian term requires optimization of both amplitude and radius. For example, if three Gaussian terms are selected for the calibration, total parameters to be optimized becomes six.

Alignment parameters typically include scale, rotation and translation parameters for 2-D alignment.

For the SEM images taken under the desired conditions (i.e., magnification, picture quality, SEM status), the scale and rotation can be assumed as common for all the pictures (i.e., same group). As such, if one group of the pictures are used for the calibration, it requires only one set of these parameters for optimization. Each scale/rotation has its x and y axis components (i.e., scale in x, scale in y, rotation in x, rotation in y). With respect to translation parameters, each SEM picture has its unique value of translation with respect to the mask data input for the calibration (i.e., translation x, y).

As an example, assuming the input condition is lock optical amplitude, three materials on mask, three Gaussian and 30 SEM images, the number of optical model parameters to be tuned equals one global optical amplitude scale plus six mask topography parameters. The number of non-optical model parameters 3×2=6; and the number of alignment parameters equals 4 (scale and rotation)+30×2(translation)=64.

Furthermore, with the multiple stage calibration process of the present invention it is also possible to add and/or change the parameters being considered, adjusted and/or fixed during the calibration process. For example, it may be desirable to be able to calibrate a model that can accurately predict the final etched patterns. In the multiple stage calibration method of the present invention, it is possible to fix all the geometries and resist parameters and then input parameters into the simulation equation that correspond to the etching process characteristic, and then continue the model calibration to include the etching process. Of course, additional variations are also possible.

Figure 9:
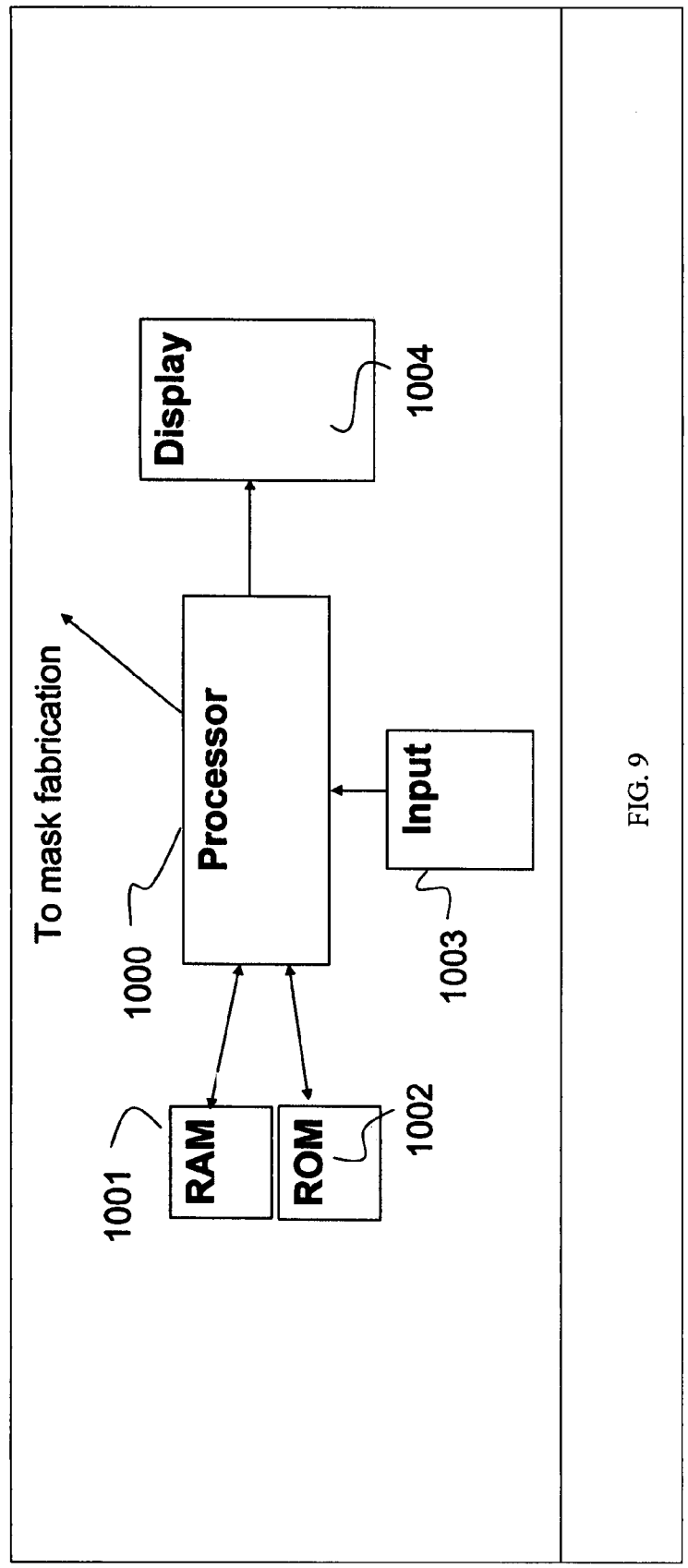
FIG. 9 illustrates an exemplary processing system for implementing the model calibration method of the present invention.

FIG. 9 illustrates an exemplary processing system for performing the calibration process of the present invention. As illustrated in FIG. 9, an exemplary processing system may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor. 1000 preferably retrieves stored protocols from ROM 1002 and RAM 1001, such as protocols to implement the methods detailed above for model calibration in accordance with the present invention, and stores information on RAM 1001.

The software functionalities of such a computer system involve programming, including executable code, may be used to implement the above described calibration method. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 10:
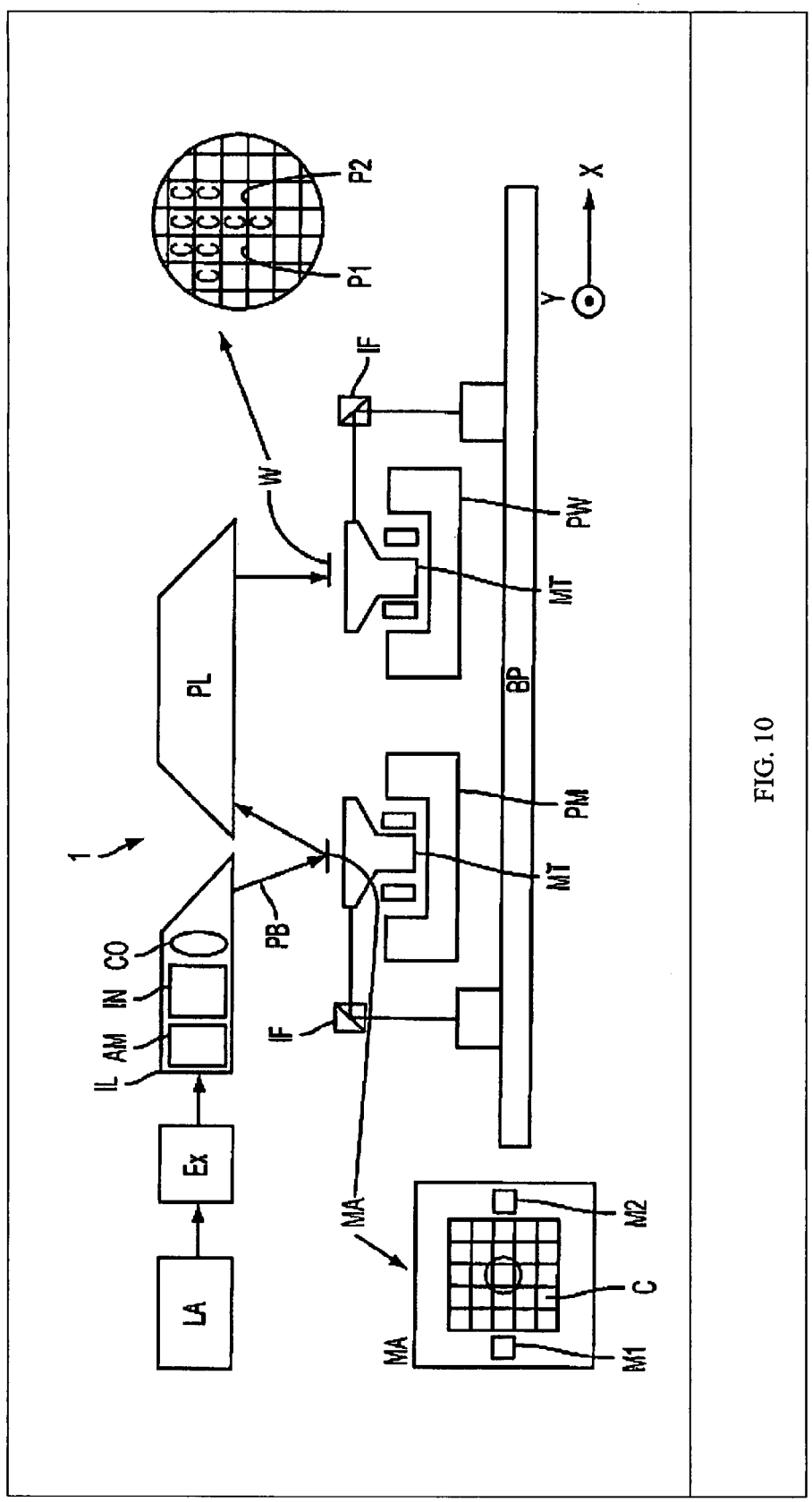
FIG. 10 schematically depicts an exemplary lithographic projection apparatus.

FIG. 10 schematically depicts a lithographic projection apparatus. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 10 that the source LA and DOE may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of calibrating a simulation model of a photolithography process, said method comprising the steps of:

defining a set of input data;

defining a simulation model having model parameters which affect the simulation result produced by said simulation model;

performing a first stage calibration process in which the model parameters and alignment parameters are adjusted such that the simulation result is within a first predefined error tolerance; and performing a second stage calibration process in which said alignment parameters are fixed and said model parameters are adjusted such that said simulation result is within a second predefined error tolerance.

2. The method of claim 1, wherein said input data includes data defining a target pattern to be imaged and data defining an imaging process to be utilized to image said target pattern.

3. The method of claim 1, wherein said model parameters include optical parameters and resist parameters.

4. The method of claim 1, wherein said alignment parameters include rotation parameters, magnification parameters and translation parameters.

5. The method of claim 4, wherein said alignment parameters are utilized to govern the alignment of the simulated image relative to the target pattern.

6. The method of claim 1, wherein the first predefined error tolerance is greater than the second predefined error tolerance.

7. A computer readable medium configured to store program instructions for execution by a computer, said program instructions enabling a calibration process of a simulation model of a photolithography process, said calibration process comprising the steps of:

defining a set of input data;

defining a simulation model having model parameters which affect the simulation result produced by said simulation model;

performing a first stage calibration process in which the model parameters and alignment parameters are adjusted such that the simulation result is within a first predefined error tolerance; and performing a second stage calibration process in which said alignment parameters are fixed and said model parameters are adjusted such that said simulation result is within a second predefined error tolerance.

8. The computer readable medium of claim 7, wherein said input data includes data defining a target pattern to be imaged and data defining an imaging process to be utilized to image said target pattern.

9. The computer readable medium of claim 7, wherein said model parameters include optical parameters and resist parameters.

10. The computer readable medium of claim 7, wherein said alignment parameters include rotation parameters, magnification parameters and translation parameters.

11. The computer readable medium of claim 10, wherein said alignment parameters are utilized to govern the alignment of the simulated image relative to the target pattern.

12. The computer readable medium of claim 7, wherein the first predefined error tolerance is greater than the second predefined error tolerance.

* * * * *